United States Patent
Kim et al.

(10) Patent No.: US 7,478,208 B2
(45) Date of Patent: Jan. 13, 2009

(54) SEMICONDUCTOR MEMORY DEVICES INCLUDING MODE REGISTERS AND SYSTEMS INCLUDING THE SAME

(75) Inventors: Joon-Kun Kim, Gyeonggi-do (KR); Dong-Yang Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 300 days.

(21) Appl. No.: 11/546,625

(22) Filed: Oct. 12, 2006

(65) Prior Publication Data
US 2007/0088921 A1 Apr. 19, 2007

(30) Foreign Application Priority Data
Oct. 13, 2005 (KR) .................. 10-2005-0096698

(51) Int. Cl.
*G06F 13/00* (2006.01)
(52) U.S. Cl. ..................... 711/154; 711/155
(58) Field of Classification Search ............ 711/154, 711/155, 166, 170; 365/191
See application file for complete search history.

(56) References Cited
U.S. PATENT DOCUMENTS
5,973,988 A 10/1999 Nakahira et al. ...... 365/230.08
7,278,004 B2 * 10/2007 Roohparvar ............... 711/169

FOREIGN PATENT DOCUMENTS
JP 08-124380 5/1996
KR 10-2005-0055861 12/2003

* cited by examiner

*Primary Examiner*—Vu A Le
(74) *Attorney, Agent, or Firm*—Myers Bigel Sibley & Sajovec (57) ABSTRACT

Semiconductor memory devices are provided. The semiconductor memory device includes a command decoder, a code converter and a code outputting unit. The command decoder is configured to receive a plurality of command signals from an external source, decode the plurality of command signals and generate a mode register reading signal responsive to the decoded plurality of command signals. The code converter is configured to receive mode setting codes generated based on the decoded plurality of command signals and convert the mode setting codes to serial mode setting codes. The code outputting unit is configured to receive the serial mode setting codes and output the serial mode setting codes to the external source responsive to the mode register reading signal. Systems including the semiconductor memory devices are also provided.

21 Claims, 5 Drawing Sheets

FIG. 5 though embodiments of the present invention are prima-

SEMICONDUCTOR MEMORY DEVICES INCLUDING MODE REGISTERS AND SYSTEMS INCLUDING THE SAME

CLAIM OF PRIORITY

This application is related to and claims priority from Korean Patent Application No. No. 2005-96698, filed Oct. 13, 2005, in the Korean Intellectual Property Office, the disclosure of which is hereby incorporated herein by reference as if set forth in its entirety.

BACKGROUND OF THE INVENTION

1. Field of the Invention

The present invention relates to semiconductor memory devices, and more particularly, to semiconductor memory devices including mode registers.

2. Description of the Related Art

Semiconductor memory devices, such as dynamic random access memories (DRAMs) or static random access memories (SRAMs), typically include mode registers. Various mode setting codes are set in the mode registers to control operating characteristics of the semiconductor memory devices.

Figure 1:
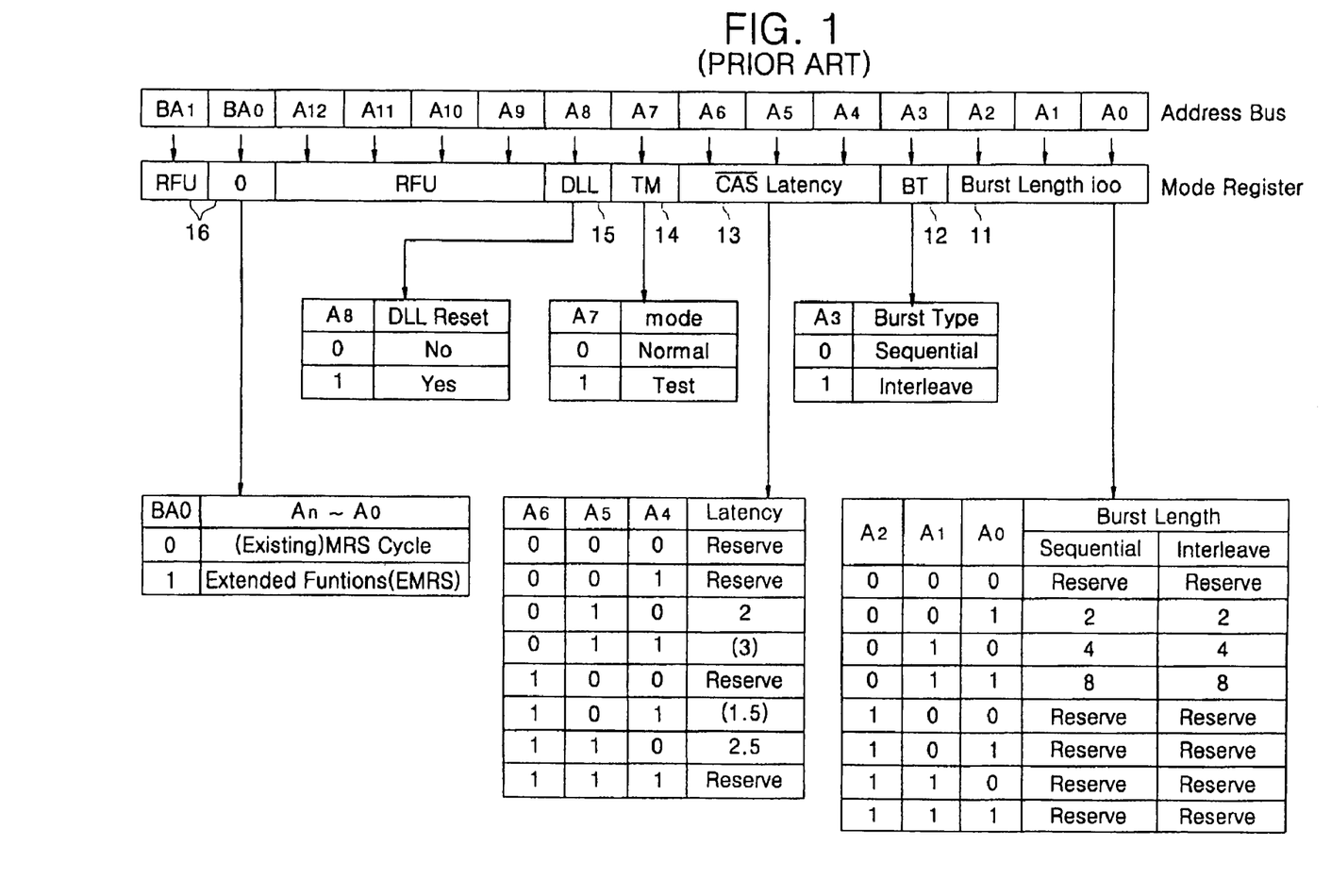
FIG. 1 illustrates an exemplary structure of a conventional mode register.

Referring to FIG. 1, an exemplary structure of conventional mode registers will be discussed. As illustrated in FIG. 1, the mode register includes code areas, such as a burst length code area 11, a burst type code area 12, a column address strobe (CAS) latency code area 13, a test mode code area 14, and a delay locked loop (DLL) reset code area 15, for controlling the operation of a semiconductor memory device. Each code area is assigned an address signal for setting mode setting codes.

In a mode register setting mode of the semiconductor memory device illustrated in FIG. 1, address signals A0 to A2 are stored in the burst length code area 11 to set a burst length, an address signal A3 is stored in the burst type code area 12 to set a burst type, address signals A4 to A6 are stored in the CAS latency code area 13 to set CAS latency, an address signal A7 is stored in the test mode code area 14 to set test operation of the semiconductor memory device, an address signal A8 is stored in the DLL resetting code area 15 to set DLL reset of the semiconductor memory device, and bank addresses BA0 and BA1 are stored in the mode register setting code area 16 to set the mode register setting mode of the semiconductor memory device.

Accordingly, conventional semiconductor memory devices support setting various mode setting codes in the mode registers having the structure illustrated in FIG. 1. However, conventional semiconductor memory devices do not typically support reading the mode setting codes that are set in the mode register. Therefore, once the mode setting codes are set in the mode registers of conventional semiconductor memory devices, the accuracy of the mode setting codes of the mode register cannot typically be checked.

For example, even when the conventional semiconductor memory device with the CAS latency code set to CAS latency 4 (CL4) in the mode register malfunctions with CAS latency 3 (CL3), the CAS latency code of the mode register cannot be checked to determine if the CAS latency code of the mode register is set to CAS latency 4 (CL4) or CAS latency 3 (CL3).

As a result, in conventional semiconductor memory devices, when malfunctions related to the mode register occur, the cause of the malfunction caused by erroneously set codes in the mode register cannot be checked. This may degrade reliability of the semiconductor memory device.

SUMMARY OF THE INVENTION

Some embodiments of the present invention provide semiconductor devices. The semiconductor device includes a command decoder, a code converter and a code outputting unit. The command decoder is configured to receive a plurality of command signals from an external source, decode the plurality of command signals and generate a mode register reading signal responsive to the decoded plurality of command signals. The code converter is configured to receive mode setting codes generated based on the decoded plurality of command signals and convert the mode setting codes to serial mode setting codes. The code outputting unit is configured to receive the serial mode setting codes and output the serial mode setting codes to the external source responsive to the mode register reading signal.

In further embodiments of the present invention, the command decoder may be further configured to generate a mode register setting signal responsive to the decoded plurality of command signals. The memory device may further include a mode register configured to receive the mode register setting signal and set the mode setting codes responsive to the mode register setting signal and code information signals received from the external source.

In still further embodiments of the present invention, the code converter may include a multiplexer configured to sequentially select the mode setting codes applied in parallel and output converted serial mode setting codes In some embodiments of the present invention, the memory device may further include a reset pin coupled to the code outputting unit and configured to have first and second modes of operation. In the first mode of operation the reset pin may be configured to output the serial mode setting codes to an external device. In the second mode of operation the reset pin may be configured to input a reset signal. The code outputting unit may include controlling means for transmitting the serial mode setting codes from the code converter to the reset pin responsive to the mode register reading signal. The code outputting unit may further include a driver configured to amplify the serial mode setting codes input from the code converter to transmit the serial mode setting codes from the code converter to the controlling means.

In further embodiments of the present invention, the mode register may include a plurality of transmission control means and a plurality of latching means. The plurality of transmission control means may be configured to transmit the code information signals responsive to the mode register setting signal. The plurality of latching means may be configured to latch the code information signals received from the plurality of transmission control means to set mode setting codes. In certain embodiments of the present invention, the code information signals may be address signals.

Although embodiments of the present invention are primarily discussed above with respect to semiconductor memory devices, systems including the semiconductor memory devices are also provided herein.

DETAILED DESCRIPTION OF OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
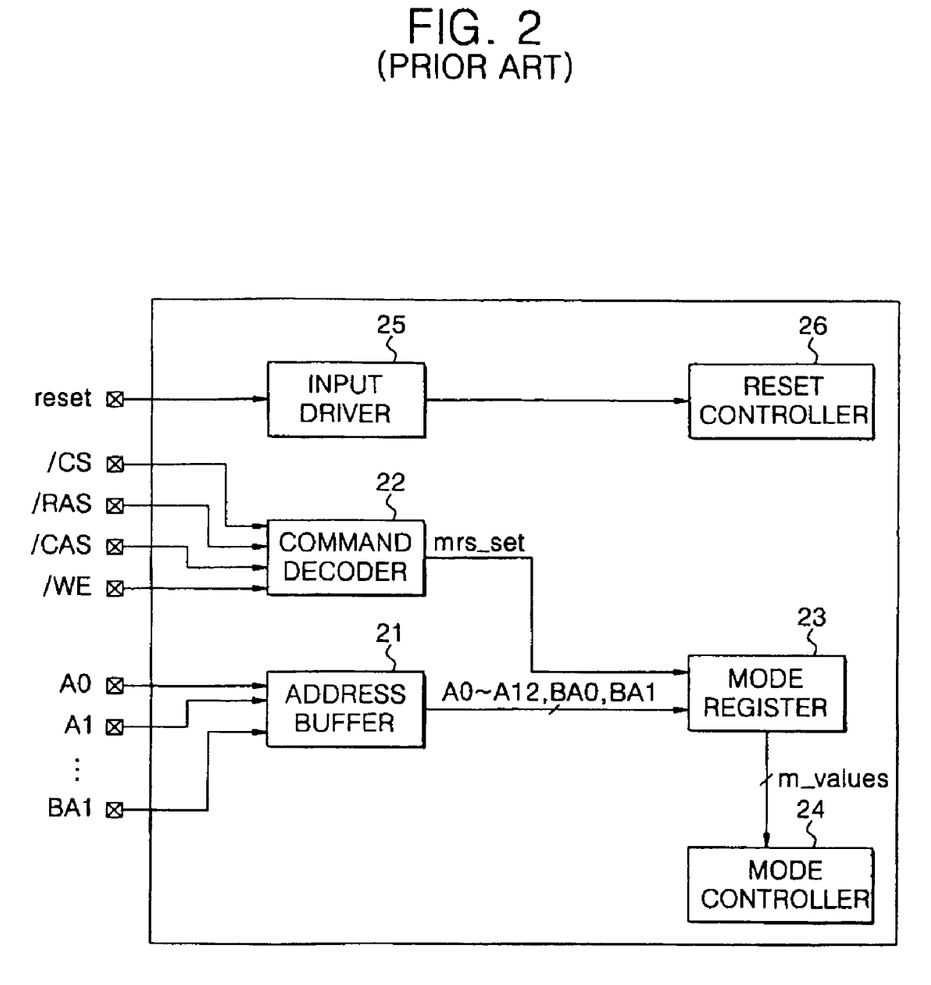
FIG. 2 is a block diagram illustrating a portion of the configuration of a conventional semiconductor memory device.

Referring now to FIG. 2, a block diagram illustrates a portion of the configuration of a conventional semiconductor memory device. As illustrated in FIG. 2, the semiconductor memory device includes an address buffer 21, a command decoder 22, a mode register 23, a mode controller 24, an input driver 25, and a reset controller 26.

The address buffer 21 is configured to buffer a plurality of address signals A0 to A12, BA0 and BA1 input through a plurality of address pins and outputs the address signals to the mode register 23. The command decoder 22 is configured to decode a plurality of command signals /CS, /RAS, /CAS and /WE input through a plurality of command pins to enable and/or disable a mode register setting signal mrs_set. The command signals /CS, /RAS, /CAS and /WE used to request perform the mode register setting operation are all typically set to a low logic level.

The mode register 23, having the same conventional structure as illustrated in FIG. 1, is configured to be enabled by the mode register setting signal mrs_set. In particular, all of the address signals (A0 to A12, BA0 and BA1) received from the address buffer 21 are latched in mode setting code areas of the mode register 23 to set various mode setting codes m_values. The mode register 23 provides the mode setting codes m_values to the mode controller 24.

The mode controller 24 is configured to generate control signals corresponding to the mode setting codes m_values set from the mode register 23 to determine the operating property of the semiconductor memory device.

Upon receipt of a reset signal reset through a reset pin, the input driver 25 is configured to amplify the input reset signal to be received by the reset controller 26 and transmits the amplified reset signal to the reset controller 26. The reset controller 26 is configured to reset the semiconductor memory device in response to the reset signal.

Operations of the conventional semiconductor memory device illustrated in FIG. 2 will now be described with reference to FIG. 2. In the mode register setting operation, an external device (not shown) inputs the command signals /CS, /RAS, /CAS and /WE to the command decoder 22. These command signals, in combination, request performance of the mode register setting operation. The external device (not shown) also inputs the address signals A0 to A12, BA0 and BA1 to the address buffer, which is configured to provide the address signals to the mode register 23 to set the mode setting codes m_values.

In particular, the command decoder 22 is configured to decode the command signals /CS, /RAS, /CAS and /WE having a combination for requesting to perform the mode register setting operation to enable the mode register setting signal mrs_set. In response to the enabled mode register setting signal mrs_set, the mode register 23 latches the plurality of address signals A0 to A12, BA0 and BA1 in each corresponding code area to set the mode setting codes m_values.

The mode controller 24 generates control signals corresponding to the mode setting codes m_values set in the mode register 23 to determine the entire operating property of the semiconductor memory device.

When the input driver 25 receives a reset signal indicating a request to perform a reset operation from the external device (not shown), it sends the reset signal to the reset controller 26. The reset controller 26 resets the semiconductor memory device.

In other words, when there is a request to perform the reset operation from the external device, the reset controller 26 unconditionally resets the semiconductor memory device irrespective of a current operation mode of the semiconductor memory device.

As discussed above, the conventional semiconductor memory device supports setting the mode register, but not reading the mode register. Furthermore, the conventional semiconductor memory device includes the reset pin, the input driver, and the reset controller to support the reset operation, as described above.

The reset operation is typically only performed when there is a user request. The reset signal is input to the semiconductor memory device at a low speed and is independent of other signals, for example, a clock signal, address signals, command signals, and data, that typically must be input or output at a high speed.

Therefore an output driver for outputting the mode setting codes m_values is connected to the reset pin, such that increased capacitance of the reset pin and generated skew do not affect the operation of the semiconductor memory device.

In some embodiments of the present invention the reset pin is used instead of a separate pin for outputting the mode setting codes m_values to external circuits. Accordingly, this may allow the mode setting codes m_values to be read as discussed further herein with respect to FIGS. 3 through 5.

Figure 3:
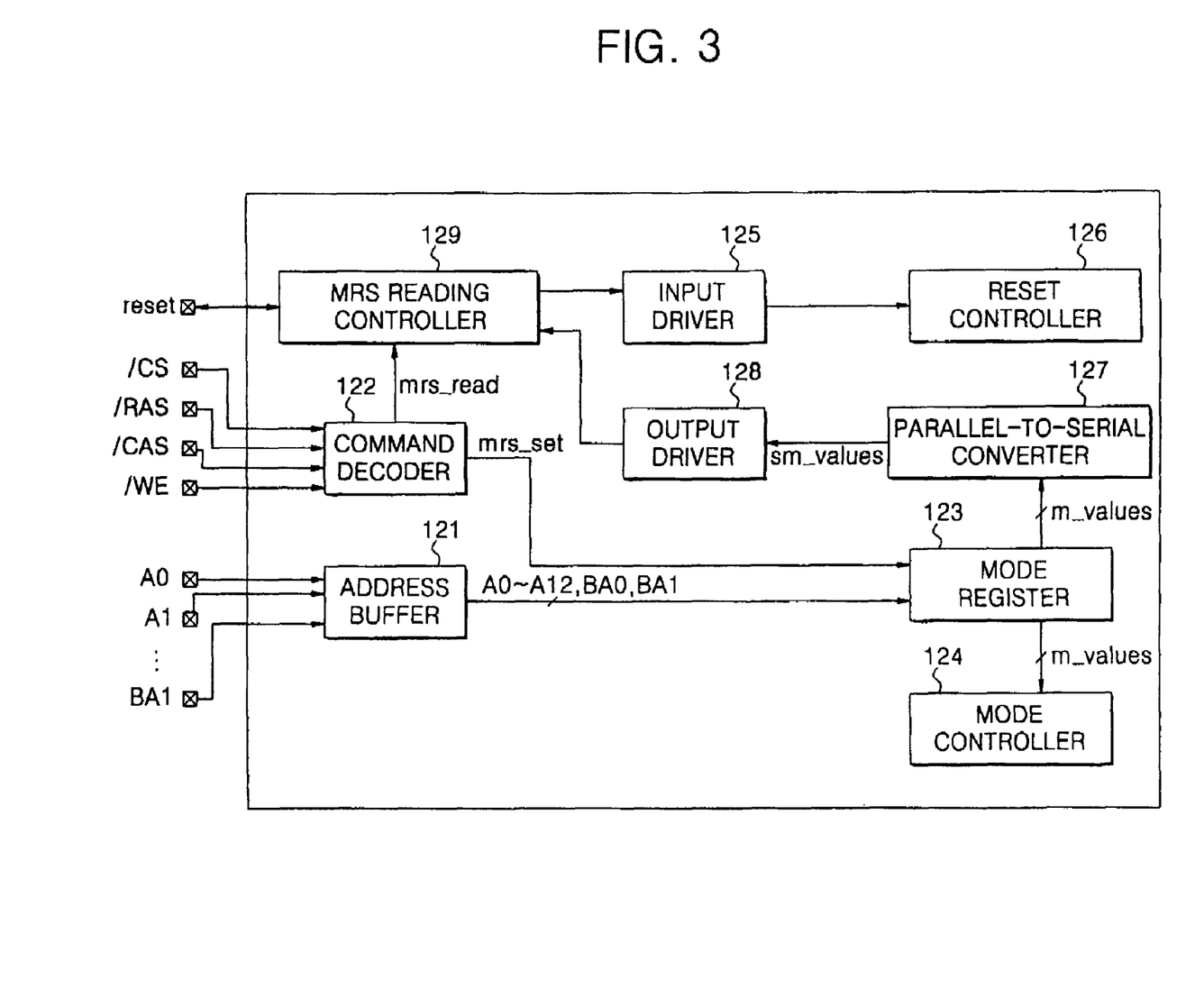
FIG. 3 is a block diagram illustrating a portion of the configuration of a semiconductor memory device according to some embodiments of the present invention.

Referring now to FIG. 3, a block diagram illustrating a portion of the configuration of a semiconductor memory device according to some embodiments of the present invention will be discussed. As illustrated in FIG. 3, the semiconductor memory device includes an address buffer 121, a command decoder 122, a mode register 123, a mode controller 124, an input driver 125, a reset controller 126, a parallel-to-serial converter 127, an output driver 128, and an MRS reading controller 129.

The address buffer 121 is configured to buffer a plurality of address signals A0 to A12, BA0 and BA1 input through a plurality of address pins and output the address signals to the mode register 123.

The command decoder 122 is configured to decode a plurality of command signals /CS, /RAS, /CAS and /WE input through a plurality of command pins to enable a mode register setting signal mrs_set in mode register setting operation or to enable a mode register reading signal mrs_read in mode register reading operation. That is, the command decoder 122 according to some embodiments of the present invention is configured to receive and analyze the plurality of command signals /CS, /RAS, /CAS and /WE input through the plurality of command pins to check an operation mode of the semiconductor memory device and enable either the mode register setting signal mrs_set or the mode register reading signal mrs_read according to the operation mode of the semiconductor memory device.

For example, when the command signals /CS, /RAS, /CAS and /WE indicate a request to perform the mode register setting operation, the command signals may all be set to a logic low level. Similarly, when the command signals /CS, /RAS, /CAS and /WE indicate a request to perform the mode register reading operation, the command signals may all be set to a logic high level.

It will be understood that the command signals and the values thereof discussed herein are provided for exemplary purposes only and, therefore, embodiments of the present invention are not limited to the examples discussed herein.

When the mode register setting signal mrs_set is enabled, the plurality of address signals received from the address buffer 121 at the mode register 123 are latched in the mode setting code areas of the mode register 123 to set various mode setting codes m_values.

The mode controller 124 generates control signals corresponding to the mode setting codes m_values set in the mode register 123 to determine the entire operating property of the semiconductor memory device.

The parallel-to-serial converter 127 is configured to receive the mode setting codes m_values set in the mode register 123 in parallel, and to serially convert the mode setting codes m_values to generate serial mode setting codes sm_values.

The output driver 128 is configured to amplify the serial mode setting codes sm_values input from the parallel-to-serial converter 127 to be received by an external device (not shown) and to transmit the amplified serial mode setting codes sm_values. to the MRS reading controller 129. The input driver 125 is configured to amplify a reset signal input from the MRS reading controller 129 to be recognized by the reset controller 126 and to transmit the amplified reset signal to the reset controller 126.

Upon receipt of the reset signal through the input driver 125, the reset controller 126 unconditionally resets the semiconductor memory device irrespective of a current operation mode of the semiconductor memory device.

Operations of the semiconductor memory device according to some embodiments of the present invention will now be described with reference to FIG. 3. In the mode register setting operation, an external device (not shown) inputs command signals /CS, /RAS, /CAS and /WE that in combination request that the mode register setting operation be performed. The external device also inputs address signals A0 to A12, BA0 and BA1 including information for setting mode setting codes m_values.

The command decoder 122 is configured to decode the command signals /CS, /RAS, /CAS and /WE configured to request that the mode register setting operation be performed to enable a mode register setting signal mrs_set and disable a mode register reading signal mrs_read.

The MRS reading controller 129 is configured to connect the reset pin to the input driver 125 in response to the mode register reading signal mrs_read. In response to the enabled mode register setting signal mrs_set, the mode register 123 is configured to latch the plurality of address signals A0 to A12, BA0 and BA1 in each corresponding code area to set mode setting codes m_values.

The mode controller 124 is configured to generate control signals corresponding to the mode setting codes m_values set in the mode register 123 to determine an operating property of the semiconductor memory device.

The parallel-to-serial converter 127 is configured to serially convert the mode setting codes m_values of the mode register 123 to generate serial mode setting codes sm_values. The output driver 128 is configured to amplify the serial mode setting codes sm_values to be received by the external device. However, the serial mode setting codes sm_values are not sent to the reset pin by the MRS reading controller 129.

Meanwhile, in the mode register reading operation, the external device inputs command signals /CS, /RAS, /CAS and /WE indicating a request to perform the mode register reading operation.

The command decoder 122 decodes the command signals /CS, /RAS, /CAS and /WE having the combination that indicates a request to perform the mode register reading operation to disable the mode register setting signal mrs_set and enable the mode register reading signal mrs_read.

In response to the mode register reading signal mrs_read, the MRS reading controller 129 connects the reset pin to the output driver 128. The serial mode setting codes sm_values, which are converted to the serial codes by the parallel-to-serial converter 127 and amplified by the output driver 128, are output to the reset pin.

When the mode register reading operation is completed in a certain time and the command signals /CS, /RAS, /CAS and /WE having the combination for requesting to perform the mode register reading operation are no longer input, the command decoder 122 disables the mode register reading signal mrs_read. The MRS reading controller 129 connects the reset pin to the input driver 125 in response to the disabled mode register reading signal mrs_read.

When the MRS reading controller 129 connects the reset pin to the input driver 125 and the reset signal is input to the reset pin, the input driver 125 amplifies the reset signal to be received by the reset controller 126. In response to the reset signal, the reset controller 126 resets the semiconductor memory device.

As discussed above, according to some embodiments of the present invention, in the mode register reading operation of the semiconductor memory device of FIG. 3, the output driver 128 is connected to the reset pin to output the serial mode setting codes sm_values to the reset pin. In this manner, the semiconductor memory device of FIG. 3 supports the mode register reading operation, as well as the mode register setting operation.

Figure 4:
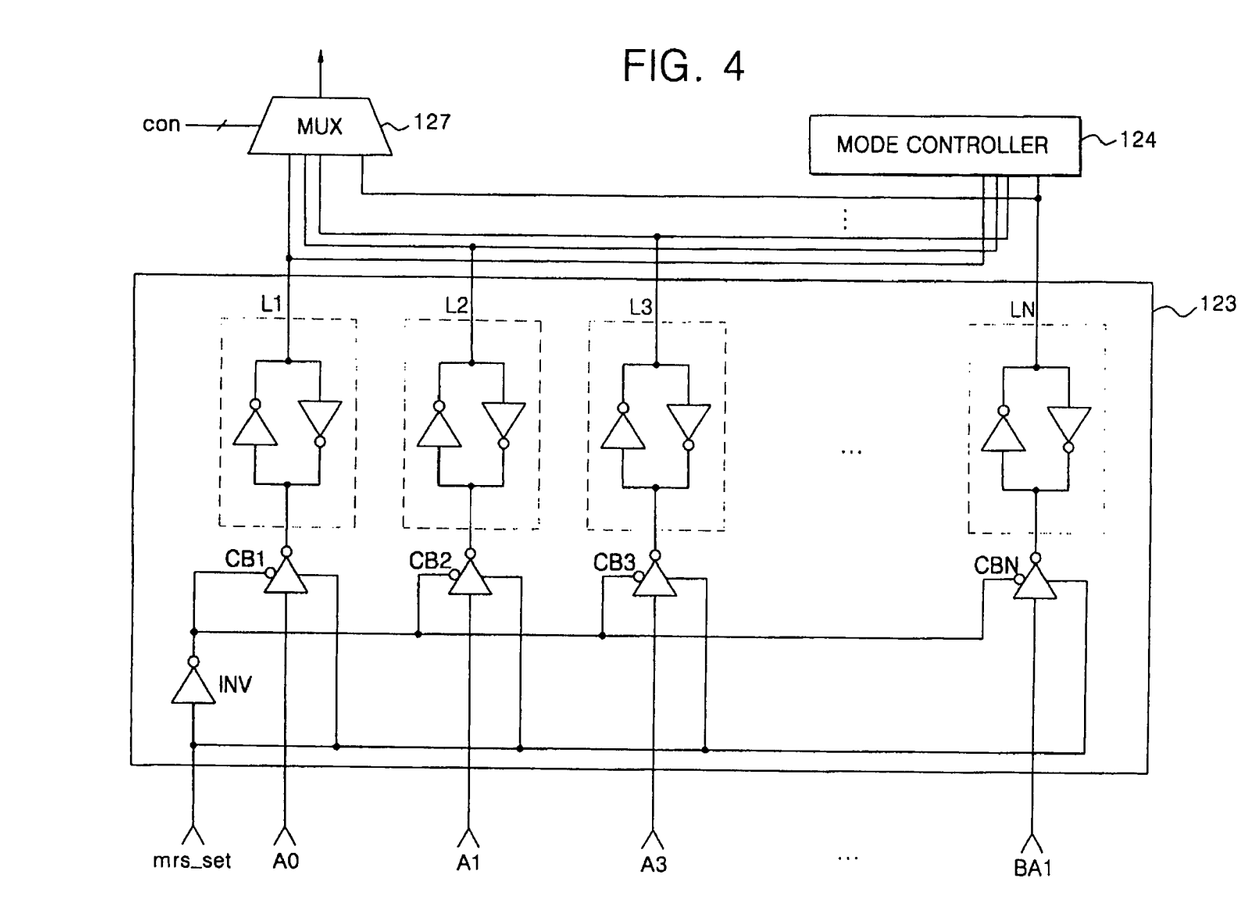
FIG. 4 is a schematic block diagram illustrating a detailed circuit of a mode register and a parallel-to-serial converter according to some embodiments of the present invention.

Referring now to FIG. 4, a schematic block diagram illustrating a circuit of the mode register and the parallel-to-serial converter according to some embodiments of the present invention will be discussed.

Referring now to FIG. 4, the mode register 123 includes an inverter INV for inverting a mode register setting signal mrs_set, a plurality of clock-buffered inverters CB1 to CBN for inverting address signals A0 to A12, BA0 and BA1 in response to the mode register setting signal mrs_set and an inverted mode register setting signal, and a plurality of latches L1 to LN for inverting and latching the inverted address signals. The plurality of address signals correspond to the plurality of clock-buffered inverters CB1 to CBN and the plurality of latches L1 to LN, respectively. A parallel-to-serial converter 127 is implemented by a multiplexer (MUX). Multiplexer (MUX) is a device for selecting one signal among the plurality of signals, so that a control signal con is applied to the multiplexer, thereby serially sequentially outputting address signals A0 to A12, BA0 and B outputted from the plurality of latches L1 to LN. Although some embodiments of the present invention are illustrated in FIG. 4, embodiments of the present invention are not limited to embodiments illustrated therein.

Operations of mode registers according to some embodiments of the present invention will now be discussed. For purposes of this example, it is assumed that the mode register setting signal mrs_set is enabled at a high logic level and disabled at a low logic level.

Upon receipt of the mode register setting signal mrs_set having a logic high level to request the mode register setting operation, the inverter INV inverts the mode register setting signal mrs_set and outputs the mode register setting signal mrs_set having a logic low level.

In response to the mode register setting signal mrs_set having a logic high level and the mode register setting signal mrs_set having a logic low level, the plurality of clock-buffered inverters CB1 to CBN invert the address signals A0 to A12, BA0 and BA1 and output inverted address signals. The plurality of latches L1 to LN invert and latch the plurality of inverted address signals. These states of the latches are kept unchanged until there is a request to perform new mode register setting operation.

The plurality of address signals A0 to A12, BA0 and BA1 latched in the plurality of latches L1 to LN are input to the mode controller 124 by which an operating property of the semiconductor memory device is controlled, and are input to the multiplexer MUX by which the address signals are converted to serial address signals and output through the reset pin to the exterior.

Figure 5:
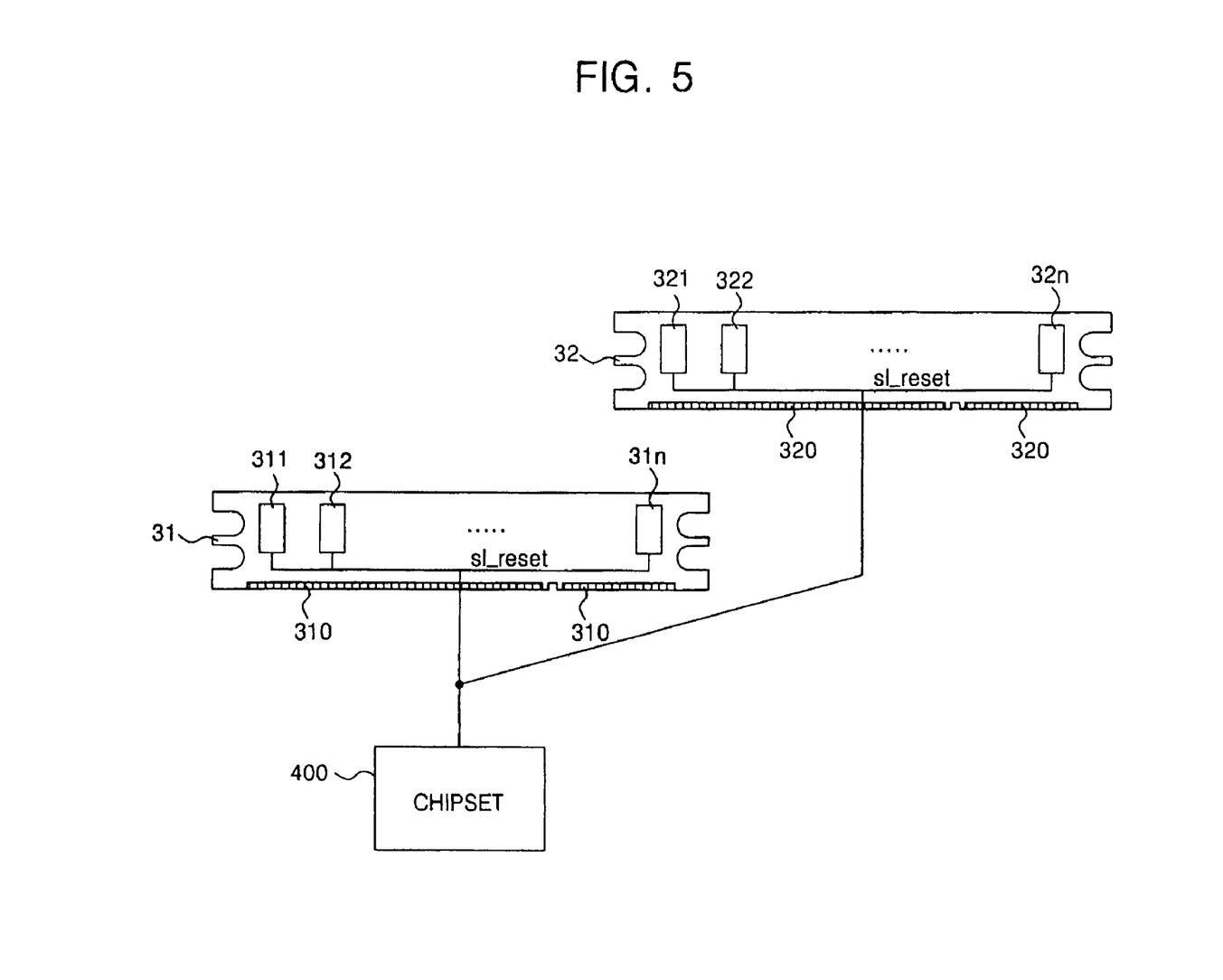
FIG. 5 is a block diagram illustrating a memory system including semiconductor memory devices according to some embodiments of the present invention.

Referring now to FIG. 5, a block diagram of a memory system including semiconductor memory devices according to some embodiments of the present invention will be discussed. As illustrated in FIG. 5, the memory system includes a plurality of memory modules 31 and 32 and a chipset 400. The memory modules 31 and 32 each have a plurality of semiconductor memory devices 311 to 31$n$ and 321 to 32$n$ configured as discussed above with respect to FIG. 3 for performing mode register setting operation and mode register reading operation, and connectors 310 and 320 electrically connected to a chipset 400. The chipset 400 controls the operation of the plurality of semiconductor memory devices 311 to 31$n$ and 321 to 32$n$.

Pins of the semiconductor memory devices 311 to 31$n$ are connected to corresponding electrical contact points of the connector 310 through signal lines, for example, a data signal line, an address signal line, a command signal line, and a reset signal line, respectively. The electrical contact points of the connector 310 are electrically connected to the chipset 400. The plurality of semiconductor memory devices 311 to 31$n$ in the memory module 31 are connected to the chipset 400 through the signal lines and the electrical contact points of the connector 310.

To perform the mode register setting operation of the semiconductor memory device 311, the chipset 400 generates a plurality of command signals /CS, /RAS, /CAS and /WE for the mode register setting operation and address signals A0 to A12, BA0, and BA1 and applies the signals to the corresponding electrical contact points of the connector 310.

The specific semiconductor memory device 311 receives the plurality of command signals /CS, /RAS, /CAS and /WE indicating a request to perform the mode register setting operation and the address signals A0 to A12, BA0 and BA1 through the electrical contact points of the connector 310 and the signal lines, and sets mode setting codes m_values in response to the signals.

Furthermore, to perform the mode register reading operation of the semiconductor memory device 311, the chipset 400 generates a plurality of command signals /CS, /RAS, /CAS and /WE indicating a request to perform the mode register reading operation and applies the command signals to the corresponding electrical contact points of the connector 310.

The specific semiconductor memory device 311 receives the plurality of command signals /CS, /RAS, /CAS and /WE indicating a request to perform the mode register reading operation through the electrical contact points of the connector 310 and the signal lines. In response to the command signals, the semiconductor memory device 311 converts the mode setting codes m_values to serial mode setting codes sm_values and outputs the serial mode setting codes sm_values to a reset pin. The serial mode setting codes sm_values are sent to the chipset 400 through a reset signal line sl_reset and the corresponding electrical contact points of the connector 310. The chipset 400 analyzes the serial mode setting codes sm_values to check whether the mode setting codes m_values of the mode register are correctly set.

When the reset pins of the plurality of semiconductor memory devices are connected to one electrical contact point of the connector in common, the mode register reading operation is performed in only one semiconductor memory device to reduce the likelihood of a collision of reset signals.

In this manner, the memory system illustrated in FIG. 5 according to some embodiments of the present invention may enable reading of the mode setting codes m_values set in the specific semiconductor memory device included in the plurality of memory modules 31 and 32, as well as setting of the mode setting codes m_values.

Accordingly, the memory system of FIG. 5 may enable a user to check whether a normal mode setting code is set in the mode register of the semiconductor memory device and whether there are any defects on address signal lines connecting the address pins to the corresponding electrical contact points.

Although some embodiments of the present invention have been described as adopting the reset pin as a pin for outputting the mode setting codes, embodiments of the present invention are not limited to this configuration. For example, it may be applied to any pin that does not affect operation of the semiconductor memory device even when capacitance of the pin increases and skew occurs without departing from the scope of the present invention.

In the semiconductor memory device of the present invention, a MRS reading controller unit, an output driver, and a parallel-to-serial converter for outputting mode setting codes are connected to a reset pin that does not affect operation of a semiconductor memory device even though capacitance of the pin increases and the skew occurs. This allows a user to read out the mode setting codes set in the semiconductor memory device without affecting the operation of the semiconductor memory device.

Thus, according to some embodiments of the present invention, it may be possible to check whether normal mode setting codes are set in a mode register of the semiconductor memory device and to check whether there are any defects on address signal lines that are formed between an address pins and corresponding electrical contact points.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor memory device comprising:
 a command decoder configured to receive a plurality of command signals from an external source, decode the plurality of command signals and generate a mode register reading signal responsive to the decoded plurality of command signals;
 a code converter configured to receive mode setting codes generated based on the decoded plurality of command signals and convert the mode setting codes to serial mode setting codes; and
 a code outputting unit configured to receive the serial mode setting codes and output the serial mode setting codes to the external source responsive to the mode register reading signal.

2. The device of claim 1, wherein the command decoder is further configured to generate a mode register setting signal responsive to the decoded plurality of command signals, the memory device further comprising:
 a mode register configured to receive the mode register setting signal and set the mode setting codes responsive to the mode register setting signal and code information signals received from the external source.

3. The device of claim 1, wherein the code converter comprise a multiplexer configured to sequentially select the mode setting codes applied in parallel and output converted serial mode setting codes.

4. The device claim 1, further comprising a reset pin coupled to the code outputting unit and configured to have first and second modes of operation, wherein in the first mode of operation the reset pin is configured to output the serial mode setting codes to an external device and wherein in the second mode of operation the reset pin is configured to input a reset signal.

5. The device of claim 4, wherein the code outputting unit comprises controlling means for transmitting the serial mode setting codes from the code converter to the reset pin responsive to the mode register reading signal.

6. The device of claim 5, wherein the code outputting unit further comprises a driver configured to amplify the serial mode setting codes input from the code converter to transmit the serial mode setting codes from the code converter to the controlling means.

7. The device of claim 2, wherein the mode register comprises:
 a plurality of transmission control means configured to transmit the code information signals responsive to the mode register setting signal; and
 a plurality of latching means configured to latch the code information signals received from the plurality of transmission control means to set mode setting codes.

8. The device of claim 2, wherein the code information signals are address signals.

9. A semiconductor memory device comprising a mode register configured to generate mode setting codes that control operations of the semiconductor memory device, wherein the semiconductor memory device is configured to allow the mode setting codes generated by the mode register to be set and read so as to allow verification that the mode setting codes are properly set.

10. The device of claim 9, further comprising
 a command decoder configured to receive a plurality of command signals from an external source, decode the plurality of command signals and generate a mode register reading signal responsive to the decoded plurality of command signals;

a code converter configured to receive the mode setting codes generated by the mode register and convert the mode setting codes to serial mode setting codes; and a code outputting unit configured to receive the serial mode setting codes and output the serial mode setting codes to the external source responsive to the mode register reading signal.

11. The device of claim 10, wherein the command decoder is further configured to generate a mode register setting signal responsive to the decoded plurality of command signals and wherein the mode register is configured to receive the mode register setting signal and set the mode setting codes responsive to the mode register setting signal and code information signals received from the external source.

12. The device claim 10, further comprising a reset pin coupled to the code outputting unit and configured to have first and second modes of operation, wherein in the first mode of operation the reset pin is configured to output the serial mode setting codes to an external device and wherein in the second mode of operation the reset pin is configured to input a reset signal.

13. A memory system comprising:

at least one memory module comprising a plurality of semiconductor memory devices, the plurality of semiconductor devices configured to latch code information signals to set mode setting codes when a mode register setting operation is selected by a plurality of command signals, and convert the mode setting codes to serial mode setting codes and output the serial mode setting codes when mode register reading operation is selected; and a memory module controller configured to transmit the plurality of command signals to request the mode register setting operation and the code information signals in the mode register setting operation, and transmit the plurality of command signals to request the mode register reading operation and receive the mode setting codes during the mode register reading operation, wherein the plurality of semiconductor memory devices comprise:

a command decoder configured to receive the plurality of command signals from an external source, decode the plurality of command signals and generate a mode register reading signal responsive to the decoded plurality of command signals;

a code converter configured to receive the mode setting codes generated based on the decoded plurality of command signals and convert the mode setting codes to the serial mode setting codes; and a code outputting unit configured to receive the serial mode setting codes and output the serial mode setting codes to the external source responsive to the mode register reading signal.

14. The system of claim 13, wherein the command decoder is further configured to generate a mode register setting signal responsive to the decoded plurality of command signals, the plurality of semiconductor memory devices further comprising:

a mode register configured to receive the mode register setting signal and set the mode setting codes responsive to the mode register setting signal and code information signals received from the external source.

15. The system of claim 13, wherein the code converter comprise a multiplexer configured to sequentially select the mode setting codes applied in parallel and output converted serial mode setting codes.

16. The system of claim 13, wherein the plurality of semiconductor memory devices further comprise a reset pin coupled to the code outputting unit and configured to have first and second modes of operation, wherein in the first mode of operation the reset pin is configured to output the serial mode setting codes to the memory module controller and wherein in the second mode of operation the reset pin is configured to input a reset signal.

17. The system of claim 16, wherein the code outputting unit comprises controlling means for transmitting the serial mode setting codes from the code converter to the reset pin responsive to the mode register reading signal.

18. The system of claim 17, wherein the code outputting unit further comprises a driver configured to amplify the serial mode setting codes input from the code converter to transmit the serial mode setting codes from the code converter to the controlling means.

19. The system of claim 14, wherein the mode register comprises:

a plurality of transmission control means configured to transmit the code information signals responsive to the mode register setting signal; and a plurality of latching means configured to latch the code information signals received from the plurality of transmission control means to set mode setting codes.

20. The system of claim 14, wherein the code information signals are address signals.

21. The system of claim 13, wherein the memory module controller is further configured to transmit the plurality of command signals requesting performance of the mode register reading operation to one of the plurality of semiconductor memory devices.

* * * * *